United States Patent
Lee

(10) Patent No.: US 7,969,218 B2
(45) Date of Patent: Jun. 28, 2011

(54) RECEIVER FOR REDUCING INTERSYMBOL INTERFERENCE OF A CHANNEL AND COMPENSATING FOR SIGNAL GAIN LOSS, AND METHOD THEREOF

(75) Inventor: Jae-wook Lee, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 1025 days.

(21) Appl. No.: 11/812,928

(22) Filed: Jun. 22, 2007

(65) Prior Publication Data
US 2008/0018370 A1    Jan. 24, 2008

(30) Foreign Application Priority Data

Jul. 19, 2006  (KR) ................. 10-2006-0067307

(51) Int. Cl.
*H03K 3/00* (2006.01)
(52) U.S. Cl. ........................ 327/206; 327/205
(58) Field of Classification Search ............ 327/205, 327/206
See application file for complete search history.

(56) References Cited

U.S. PATENT DOCUMENTS

| | | | |
|---|---|---|---|
| 4,977,597 A | 12/1990 | Horl et al. | |
| 5,565,812 A * | 10/1996 | Soenen | 327/558 |
| 6,808,494 B2 * | 10/2004 | Shifrin | 600/437 |
| 6,982,582 B1 * | 1/2006 | Cheng | 327/205 |

FOREIGN PATENT DOCUMENTS

| | | |
|---|---|---|
| JP | 2002-368830 | 12/2002 |
| KR | 90-2658 | 2/1990 |

OTHER PUBLICATIONS

Chinese Office Action dated Oct. 27, 2010.

* cited by examiner

*Primary Examiner* — Lincoln Donovan
*Assistant Examiner* — Daniel Rojas
(74) *Attorney, Agent, or Firm* — Harness, Dickey & Pierce, P.L.C.

(57) ABSTRACT

Example embodiments are directed to a receiver for reducing ISI of at least one data transmission channel and compensating for signal gain loss, and method thereof. A receiver may include a high pass filter and a Schmitt trigger controlled by a plurality of first control signals and a plurality of second control signals. The plurality of first control signals and the plurality of second control signals may be used to shift a first trigger voltage and a second trigger voltage of the Schmitt trigger. A method of reducing intersymbol interference and compensating for signal gain loss of a receiver connected to at least one data transmission channel is also provided.

9 Claims, 9 Drawing Sheets

RECEIVER FOR REDUCING INTERSYMBOL INTERFERENCE OF A CHANNEL AND COMPENSATING FOR SIGNAL GAIN LOSS, AND METHOD THEREOF

PRIORITY STATEMENT

This application claims the benefit of Korean Patent Application No. 10-2006-0067307, filed on Jul. 19, 2006, in the Korean Intellectual Property Office, the entire contents of which is incorporated herein by reference.

BACKGROUND

1. Field

Example embodiments relate to an electronic circuit, for example, to a receiver for reducing intersymbol interference (ISI) of a data transmission channel and compensating for signal gain loss, and method thereof.

2. Description of the Related Art

As the operating speed of semiconductor chips increases, so too may data transfer rates. A data input/output rate may also increase due to restrictions on the number of pins in the semiconductor chip. ISI may cause the degradation of signal quality in nonlinear components of a data transmission channel.

FIG. 1 illustrates a circuit of an example conventional data transmission channel. Referring to FIG. 1, a signal A output from a transmitter 110 may be transmitted to a receiver 130 through a channel 120. The receiver 130 may include a comparator 132 which may compare a signal B, having passed through the channel 120, to a reference voltage Vref, and an amplifier 134 which may amplify the output signals of the comparator 132.

FIGS. 2A, 2B and 2C illustrate example waveforms of signals transmitted through the data transmission channel of FIG. 1. FIG. 2A illustrates an example signal A output from the transmitter 110 of FIG. 1. FIG. 2B illustrates an example signal B passed through the channel 120 of FIG. 1. FIG. 2C illustrates an example output signal CO of the amplifier 134 of FIG. 1. The output signal CO of the amplifier 134 may have an 'eye' characteristic as illustrated in FIG. 3. Referring to FIG. 3, two eyes may exist in the signal CO and jitter noise may be widely distributed between the two eyes. This jitter noise may be caused by ISI.

Jitter noise caused by ISI of a data transmission channel may be removed using a signal shaper circuit, as disclosed in U.S. Pat. No. 5,565,812. Referring to FIG. 4, the signal shaper circuit may include a high pass filter 221, which may include a switched capacitor to receive an input signal IN, a comparator 222, a capacitance 223 and a Schmitt trigger 224. The high pass filter 221 may include two similarly constructed gain stages A and B, with a nominal gain of about 10 and a time constant of about 50 sample periods. The second gain stage B may be followed by the comparator 222. The gain stages may have a balanced, fully-differential structure. This example architecture may improve power supply rejection and immunity to parasitic effects. Amplifiers may be designed in such a way that their common mode operating point may be stabilized. The comparator 222 may have a differential input provided by the gain stages A and B and a single-ended output, and may provide a first approximation of the incoming digital signal. The capacitance 223 may be added at the output of the comparator 222 in order to limit its high-frequency response. The Schmitt trigger 224 may restore signal logic levels. The combination of the comparator 222 and the Schmitt trigger 224 may reduce very fast noise spikes, which may otherwise be sampled and misinterpreted.

The signal shaper circuit illustrated in FIG. 4 may have the frequency response characteristics illustrated in FIG. 5. Referring to FIG. 5, to receive an input signal IN modulated at a specific frequency, noise of frequency bands other than the modulation frequency may be removed. Noise from lower frequency bands may be removed by controlling a cut-off frequency using the switched capacitor, and noise from higher frequency bands may be removed using the Schmitt trigger 224. That is, the signal shaper circuit illustrated in FIG. 4 may improve the signal-to-noise ratio (SNR) of a signal.

However, the characteristics of a data transmission channel may vary with frequency. The gain of a receiver, for example, the signal shaper circuit illustrated in FIG. 4, may vary with channel characteristics as illustrated in FIG. 6, and gain loss may depend on frequency. Accordingly, a receiver capable of reducing ISI of a data transmission channel and gain loss according to frequency may help mitigate several detrimental effects.

SUMMARY

Example embodiments are directed to a receiver for reducing intersymbol interference of at least one data transmission channel and compensating for signal gain loss, and method thereof.

According to example embodiments, the receiver may include a high pass filter and a Schmitt trigger controlled by a plurality of first control signals and a plurality of second control signals. The plurality of first control signals and the plurality of second control signals may be used to shift a first trigger voltage and a second trigger voltage of the Schmitt trigger. The high pass filter may be configured to receive a first input signal passed through a first channel and the Schmitt trigger may be configured to compare a first signal from the high pass filter to a first power supply voltage in response to the plurality of first control signals and the plurality of second control signals, and to generate a first output signal and a second output signal.

The receiver may also include a controller configured to generate the plurality of first control signals and the plurality of second control signals, as well as an amplifier configured to receive the first output signal and the second output signal, and to generate an output signal of the receiver.

The Schmitt trigger may include first and second resistors, first through fourth NMOS transistors, and first and second trigger voltage controllers. The first and second resistors may have first terminals to which a second power supply voltage maybe applied. The first NMOS transistor may have a drain connected to a second terminal of the first resistor to output the second output signal, and a gate to which the first signal from the high pass filter may be applied. The second NMOS transistor may have a drain connected to a second terminal of the second resistor to output the second output signal, and a gate to which the first power supply voltage may be applied. The third NMOS transistor may have a drain connected to the second terminal of the first resistor, and a gate to which the first output signal may be applied. The fourth NMOS transistor may have a drain connected to the second terminal of the second resistor, and a gate to which the second output signal may be applied. The first trigger voltage controller may be connected to the sources of the first and second NMOS transistors and a ground voltage source, and may be controlled by the plurality of second control signals. The second trigger voltage controller may be connected to the sources of the third and fourth NMOS transistors and the ground voltage source, and may be controlled by the plurality of first control signals.

The first trigger voltage controller may include a plurality of current sources connected to the sources of the first and second NMOS transistors and a plurality of NMOS transistors, each respectively connected to one of the plurality of current sources and the ground voltage source. The gates each of the plurality of NMOS transistors may respectively receive one of the plurality of second control signals.

The second trigger voltage controller may include a plurality of current sources connected to the sources of the third and fourth NMOS transistors and a plurality of NMOS transistors, each respectively connected to one of the plurality of current sources and the ground voltage source. The gates of each of the plurality of NMOS transistors may respectively receive one of the plurality of first control signals.

The high pass filter may include a capacitor and a resistor. The capacitor may have a first terminal to which the first input signal passed through the first channel may be applied. The resistor may be connected to a second terminal of the capacitor and the source of the first power supply voltage. The signal of the second terminal of the capacitor may become the first signal from the high pass filter.

The first power supply voltage may be a termination voltage applied to the first channel.

The high pass filter may be further configured to receive a second input signal passed through a second channel and the Schmitt trigger may be further configured to compare a second signal from the high pass filter to the first power supply voltage in response to the plurality of first control signals and the plurality of second control signals.

With a second input signal, the Schmitt trigger may include first and second resistors, first through fourth NMOS transistors, and first and second trigger voltage controllers. The first and second resistors may have first terminals to which a power supply voltage may be applied. The first NMOS transistor may have a drain connected to a second terminal of the first resistor to output the second output signal, and a gate to which the first signal from the high pass filter may be applied. The second NMOS transistor may have a drain connected to a second terminal of the second resistor to output the first output signal, and a gate to which the second signal from the high pass filter may be applied. The third NMOS transistor may have a drain connected to the second terminal of the first resistor, and a gate to which the first output signal may be applied. The fourth NMOS transistor may have a drain connected to the second terminal of the second resistor, and a gate to which the second output signal may be applied. The first trigger voltage controller may be connected to the sources of the first and second NMOS transistors and a ground voltage source, and may be controlled by the plurality of second control signals. The second trigger voltage controller may be connected to the sources of the third and fourth NMOS transistors and the ground voltage source, and may be controlled by the plurality of first control signals.

The first trigger voltage controller may include a plurality of current sources connected to the sources of the first and second NMOS transistors and a plurality of NMOS transistors, each respectively connected to one of the plurality of current sources and the ground voltage source. The gates of each of the plurality of NMOS transistors may respectively receive one of the plurality of second control signals.

The second trigger voltage controller may include a plurality of current sources connected to the sources of the third and fourth NMOS transistors and a plurality of NMOS transistors, each respectively connected to one of the plurality of current sources and the ground voltage source. The gates of each of the plurality of NMOS transistors may respectively receive one of the plurality of first control signals.

The high pass filter may include first and second capacitors and first and second resistors. The first capacitor may have a first terminal to which the first input signal passed through the first channel may be applied. The first resistor may be connected to a second terminal of the first capacitor and the source of the first power supply voltage. The second capacitor may have a first terminal to which the second input signal passed through the second channel may be applied. The second resistor may be connected to a second terminal of the second capacitor and the source of the first power supply voltage. The signal of the second terminal of the first capacitor may become the first signal from the high pass filter, and the signal of the second terminal of the second capacitor may become the second signal from the high pass filter.

The first power supply voltage may be a termination voltage applied to each of the at least one channels.

A method of reducing intersymbol interference and compensating for signal gain loss in a receiver connected to at least one data transmission may include receiving at least one input signal passed through a corresponding channel, generating a first output signal using a high pass filter in response to the at least one input signal, generating a plurality of first control signals and a plurality of second control signals in order to shift a first trigger voltage and a second trigger voltage of a Schmitt trigger, generating a second output signal and a third output signal by comparing the first output signal to a first power supply voltage in response to the plurality of first control signals and the plurality of second control signals, and generating an output signal of the receiver in response to the second output signal and the third output signal.

Accordingly, the receiver may compensate for ISI of a data transmission channel and signal gain loss using the high pass filter and the Schmitt trigger controlled by the first and second control signals.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
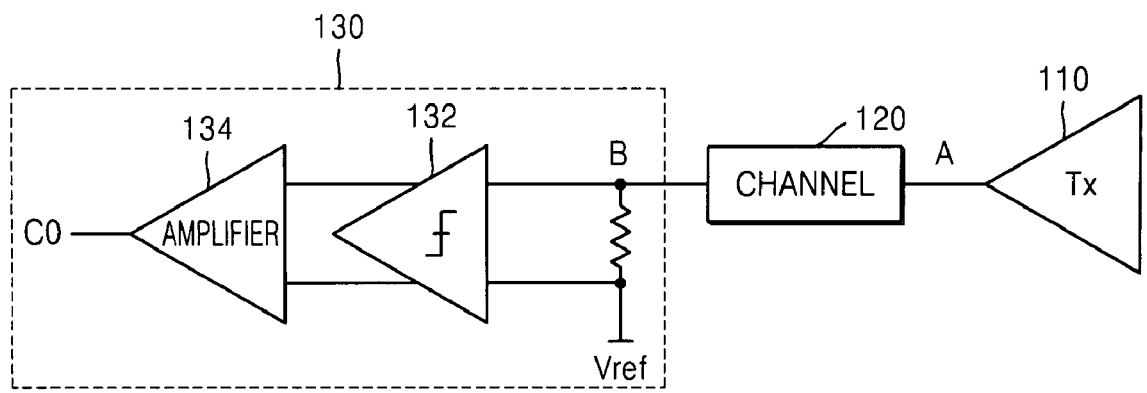
FIG. 1 illustrates an example circuit of a conventional data transmission channel.
Figure 2A:
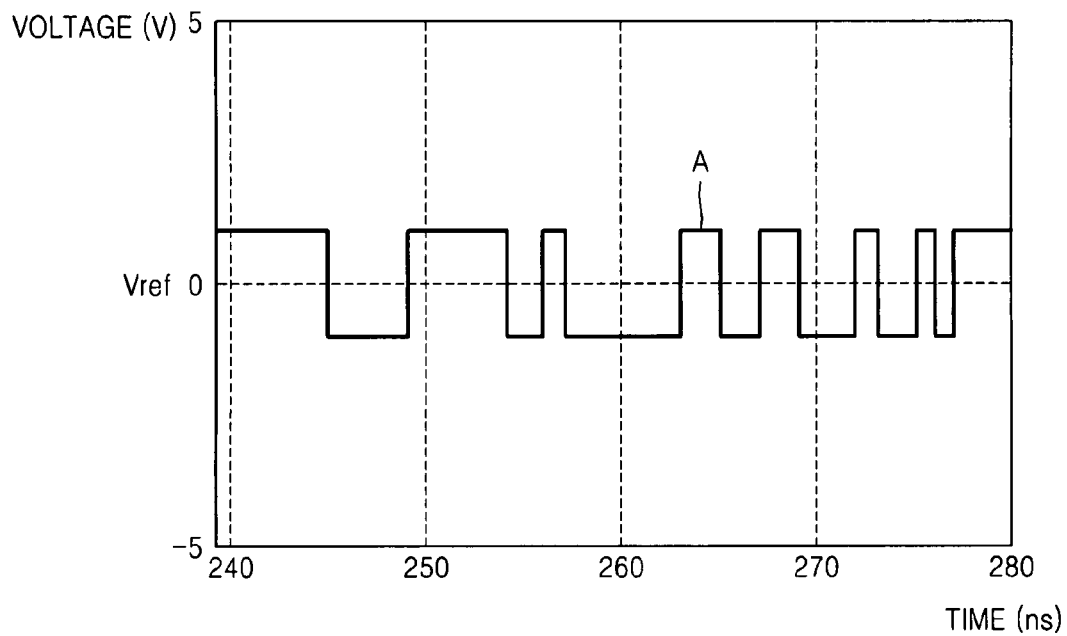
FIGS. 2A, 2B and 2C illustrate example waveforms of signals transmitted through the data transmission channel illustrated in FIG. 1.
Figure 2B:
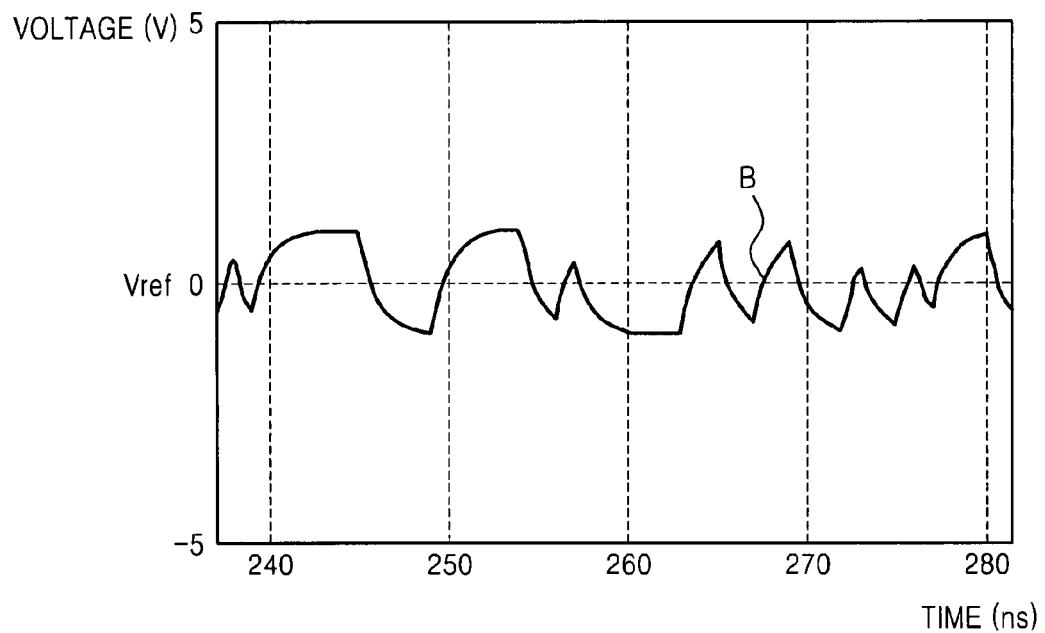
Figure 2C:
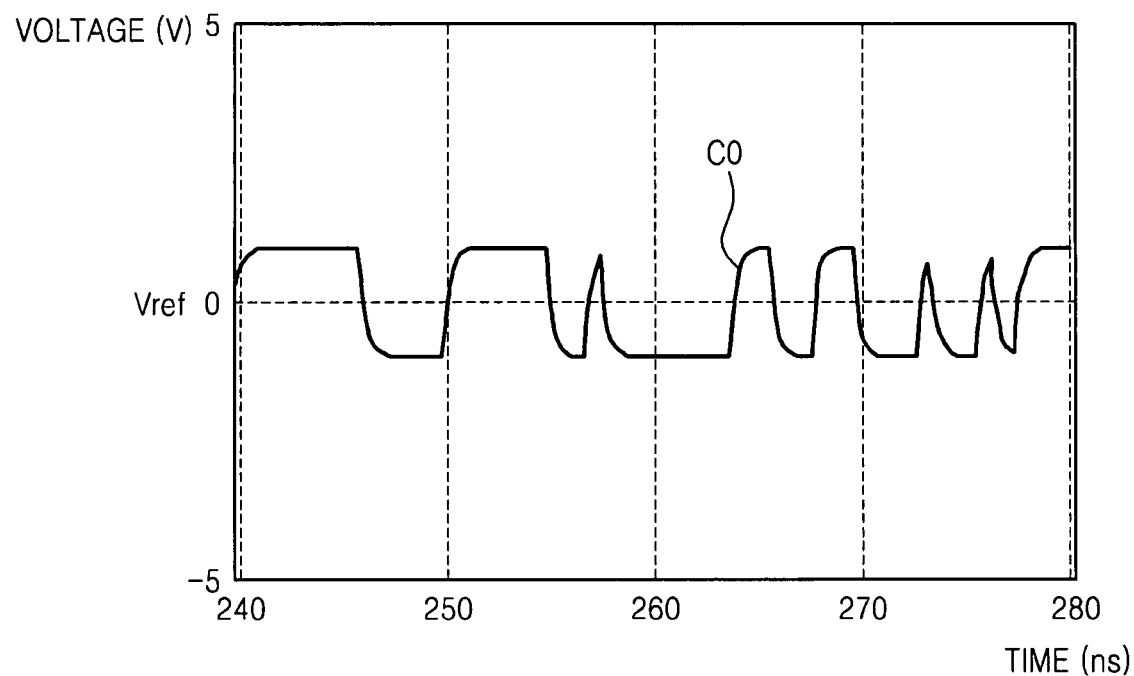
Figure 3:
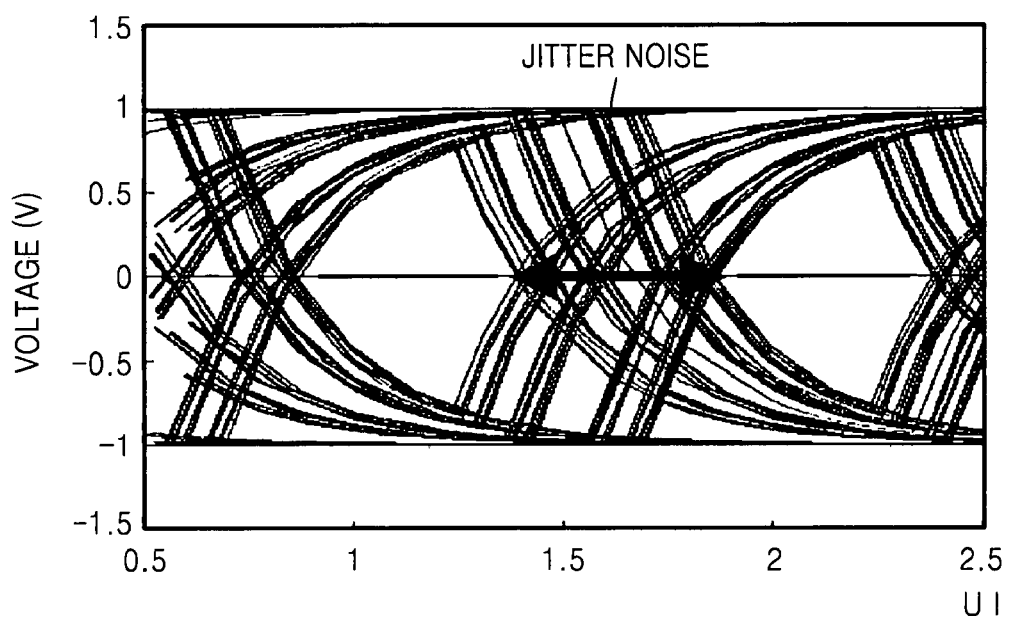
FIG. 3 illustrates example eye characteristics of the output signal of an amplifier illustrated in FIG. 1.
Figure 4:
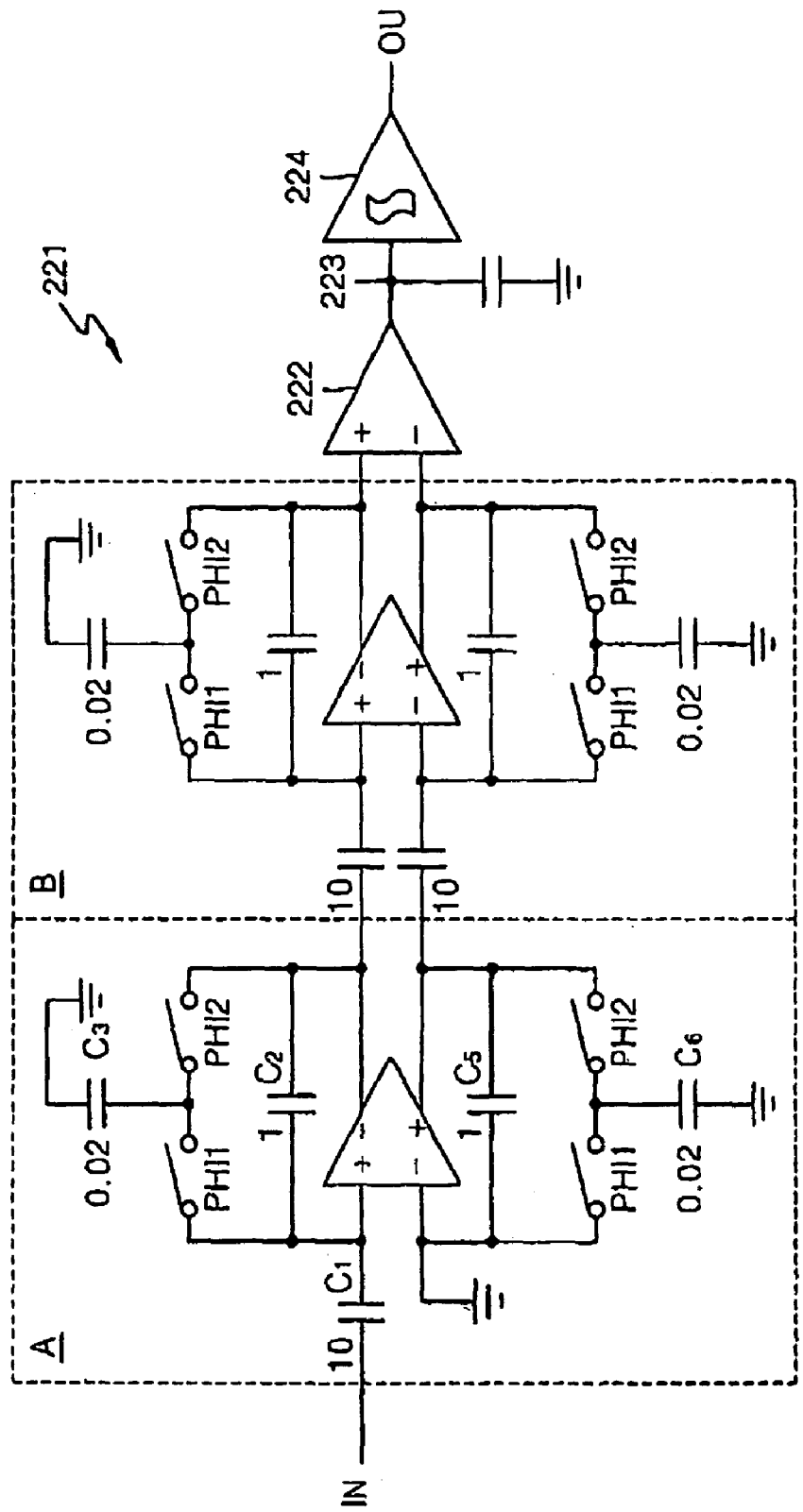
FIG. 4 illustrates an example conventional signal shaper circuit.
Figure 5:
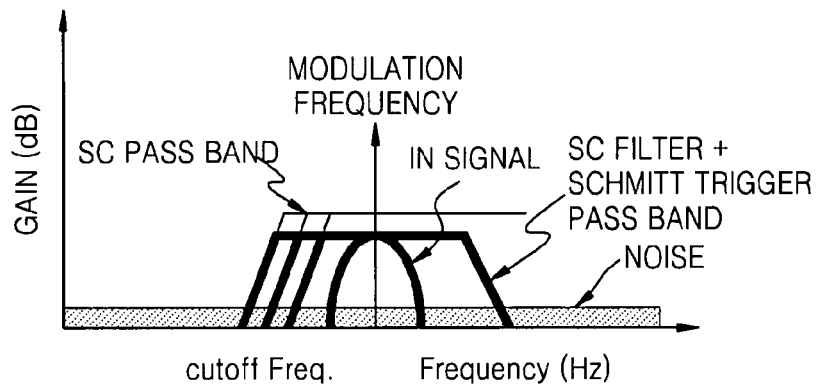
FIG. 5 illustrates example frequency response characteristics of the signal shaper circuit illustrated in FIG. 4.
Figure 6:
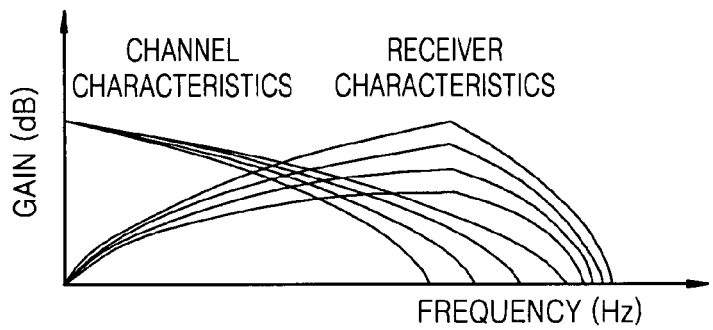
FIG. 6 illustrates example signal gain loss according to certain channel characteristics.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 7:
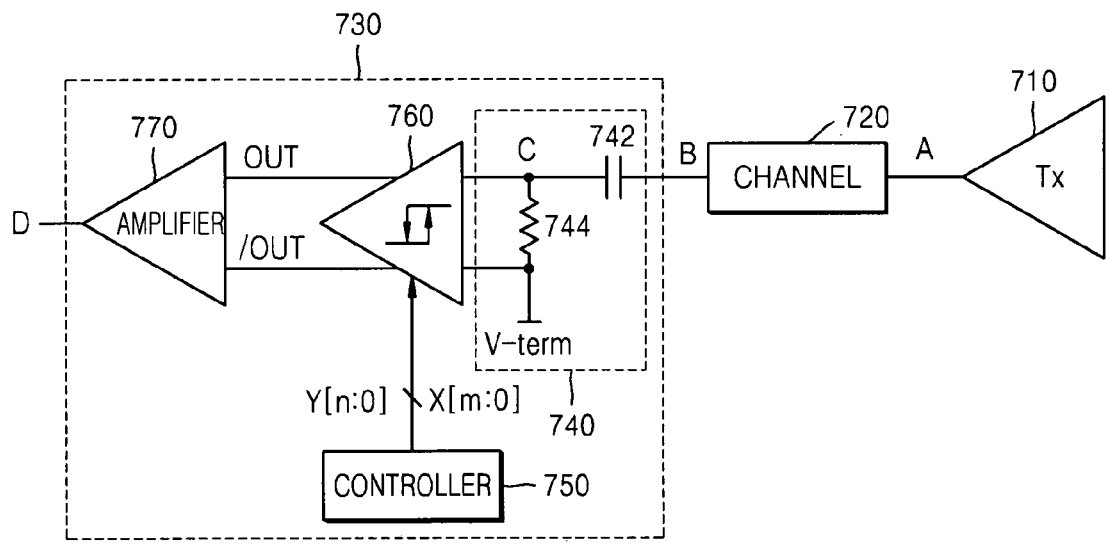
FIG. 7 illustrates an example receiver according to example embodiments.

FIG. 7 illustrates a receiver 730 according example embodiments. Referring to FIG. 7, a signal A output from a transmitter 710 in a single-ended signaling mode may be transmitted to the receiver 730 through a channel 720. The receiver 730 may include a high pass filter 740, a controller 750, a Schmitt trigger 760, and an amplifier 770.

The high pass filter 740 may include a capacitor 742 having a first terminal which may receive a signal B passed through the channel 720, and a resistor 744 connected to a second terminal of the capacitor 742 and the source of a first power supply voltage V_term. The controller 750 may generate first control signals X[m:0] and second control signals Y[n:0] to control first and second trigger voltages Vth_0 and Vth_1 of the Schmitt trigger 760. The Schmitt trigger 760 may compare the output signal C of the high pass filter 740 to the first power supply voltage V_term in response to the first and second control signals X[m:0] and Y[n:0], and may generate output signals OUT and /OUT. The amplifier 770 may amplify the output signals OUT and /OUT of the Schmitt trigger 760, and may generate the output signal D of the receiver 730. The first power supply voltage V_term may be a termination voltage of the channel 720.

Figure 8:
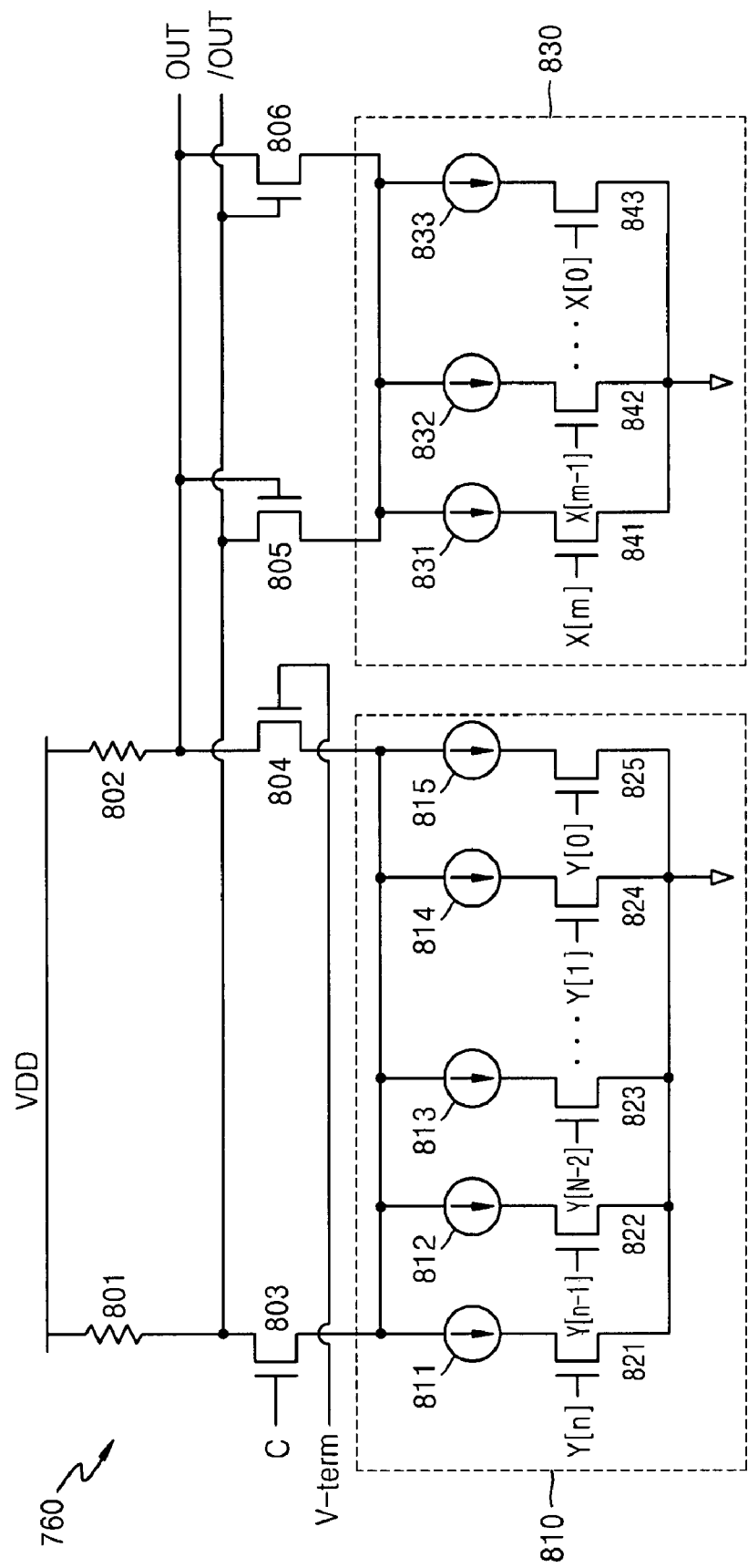
FIG. 8 is an example circuit diagram of a Schmitt trigger illustrated in FIG. 7.

FIG. 8 is a circuit diagram of the Schmitt trigger 760 illustrated in FIG. 7. Referring to FIG. 8, the Schmitt trigger 760 may include first and second resistors 801 and 802. A power supply voltage VDD may be applied to first terminals of the first and second resistors 801 and 802. A second terminal of the first resistor 801 may be connected to the drains of first and third NMOS transistor 803 and 805. The signal at the second terminal of the first resistor 801 may become the second output signal /OUT of the Schmitt trigger 760. A second terminal of the second resistor 802 may be connected to the drains of second and fourth NMOS transistors 804 and 806. The signal at the second terminal of the second resistor 802 may become the first output signal OUT of the Schmitt trigger 760.

The sources of the first and second NMOS transistors 803 and 804 may be connected to a first trigger voltage controller 810. The first trigger voltage controller 810 may include a plurality of current sources 811 through 815 connected to the sources of the first and second NMOS transistors 803 and 804, and a plurality of NMOS transistors 821 through 825 connected to the plurality of current sources 811 through 815, respectively. The gates of the NMOS transistors 821 through 825 may receive the second control signals Y[n:0], respectively.

The gate of the third NMOS transistor 805 may be connected to the first output signal OUT of the Schmitt trigger 750, and the gate of the fourth NMOS transistor 806 may be connected to the second output signal /OUT of the Schmitt trigger 760. The third and fourth NMOS transistors 805 and 806 may latch the output signal C of the high pass filter 730 illustrated in FIG. 7. The sources of the third and fourth NMOS transistors 805 and 806 may be connected to a second trigger voltage controller 830. The second trigger voltage controller 830 may include a plurality of current sources 831, 832 and 833 connected to the sources of the third and fourth NMOS transistors 805 and 806, and a plurality of NMOS transistors 841, 842 and 843 connected to the plurality of current sources 831, 832 and 833, respectively. The gates of the NMOS transistors 841, 842 and 843 may respectively receive the first control signals X[m:0].

Figure 9:
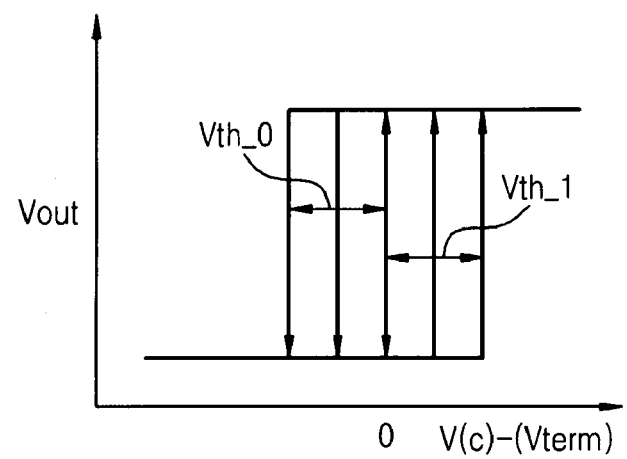
FIG. 9 is an example signal diagram showing the operation of the Schmitt trigger illustrated in FIG. 7.

FIG. 9 illustrates the operation of the Schmitt trigger 760. Referring to FIG. 9, as the number of signals at a logic high level among the first and second control signals X[m:0] and Y[n:0] increases, the first and second trigger voltages Vth_0 and Vth_1 may be shifted to a higher level.

Figure 10:
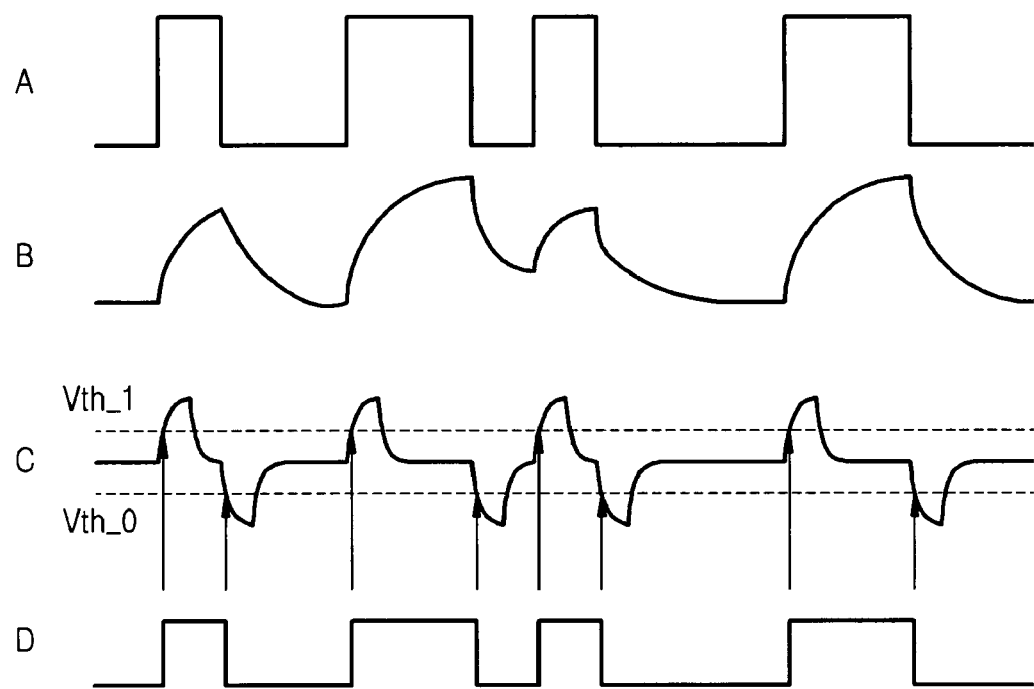
FIG. 10 is an example timing diagram showing the operation of the receiver illustrated in FIG. 7.

FIG. 10 is an example timing diagram for explaining the operation of the receiver 730 illustrated in FIG. 7. Referring to FIG. 10, the signal A output from the transmitter 710 may be changed to signal B while passing through the channel 720. Signal B may pass through the high pass filter 740 and become signal C. The first and second trigger voltages Vth_0 and Vth_1 may control whether the output signal C of the high pass filter 740 has a logic low level or a logic high level, and the output signal C may be output as the output signal D of the receiver 730.

Figure 11A:
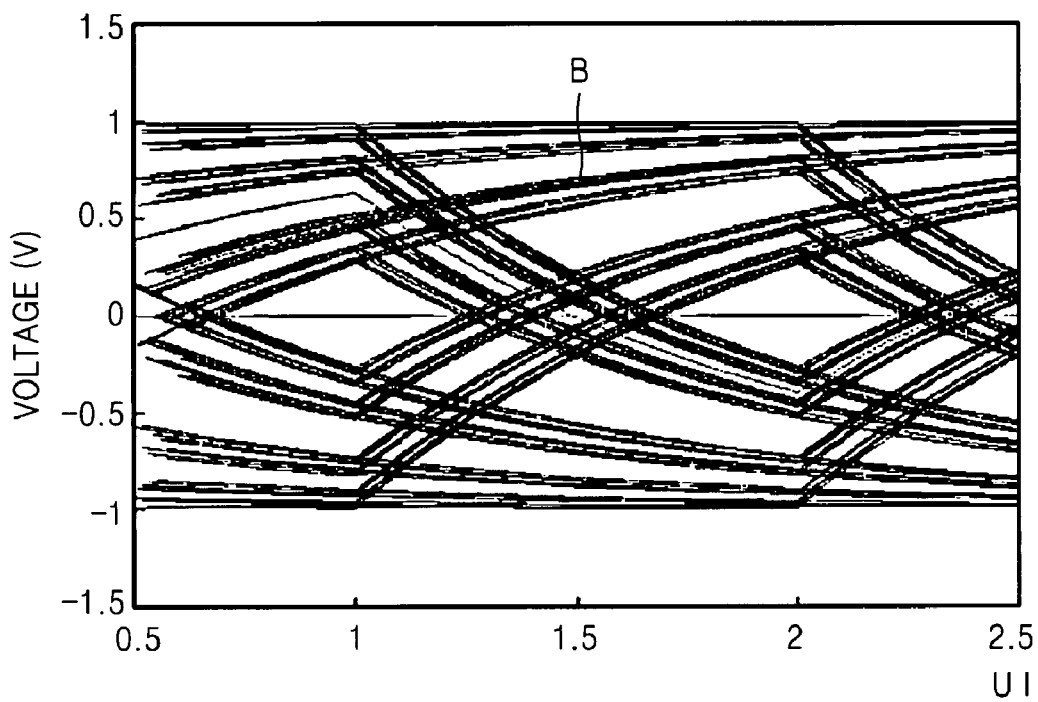
FIGS. 11A and 11B are example eye diagrams of a signal passed through a channel illustrated in FIG. 7 and an example output signal of the receiver illustrated in FIG. 7.
Figure 11B:
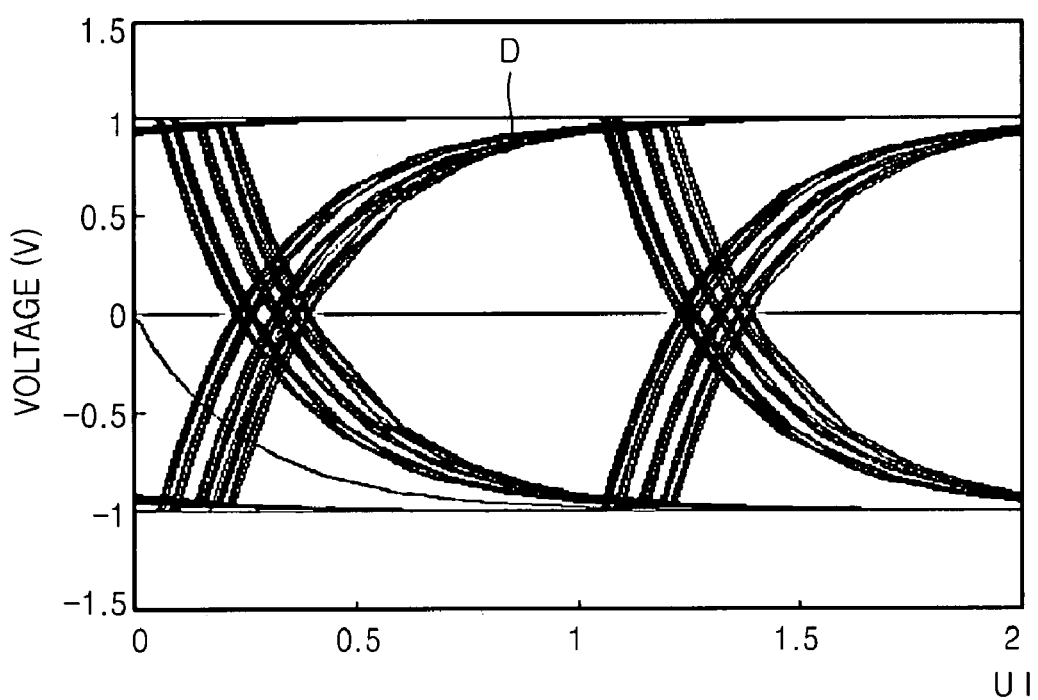

FIGS. 11A and 11B illustrate example 'eye' diagrams of signal B passed through the channel 720 illustrated in FIG. 7 and the output signal D of the receiver 730 illustrated in FIG. 7. FIGS. 11A and 11B show that less jitter noise may exist in the eye of the output signal D of the receiver 730, illustrated in FIG. 11B, than in the eye of the output signal CO of the conventional receiver 130 illustrated in FIG. 1.

Figure 12:
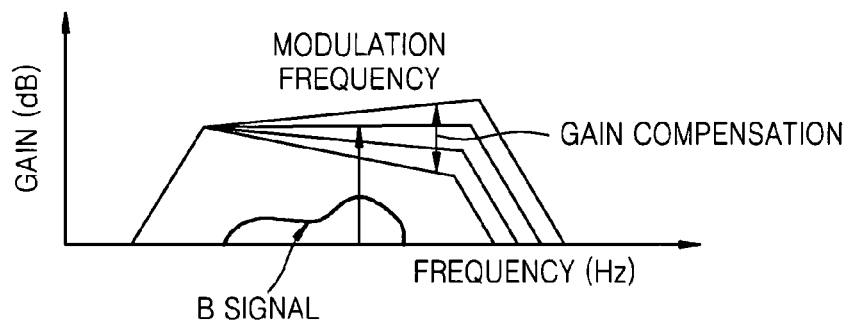
FIG. 12 illustrates example frequency response characteristics of the receiver illustrated in FIG. 7.

FIG. 12 illustrates example frequency response characteristics of the receiver 730 illustrated in FIG. 7. Referring to FIG. 12, to receive the signal B modulated at a specific frequency, the signal gain of the receiver 730 may be varied by the high pass filter 740 of the receiver 730 and the Schmitt trigger 760 may be controlled by the first and second control signals X[m:0] and Y[n:0], to compensate for signal gain loss according to data transmission channel characteristics.

Figure 13:
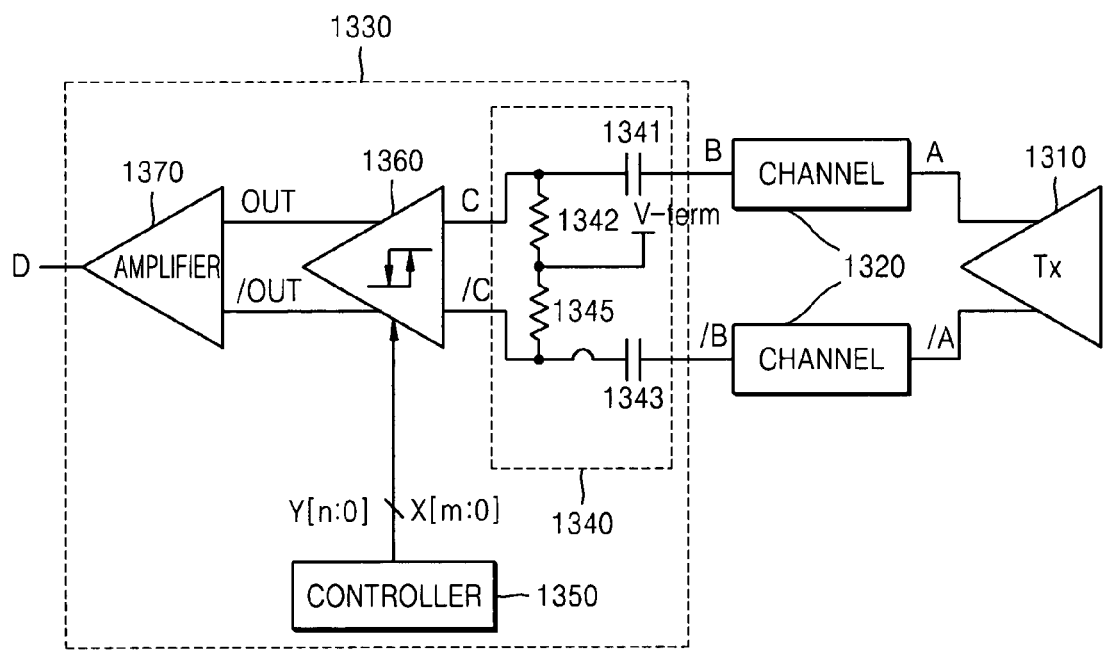
FIG. 13 illustrates an example receiver of a differential signaling type according to example embodiments.

FIG. 13 illustrates an example receiver 1330 of a differential signaling type according to example embodiments. Referring to FIG. 13, first and second differential signals A and /A output from a transmitter 1310 may be transmitted to the receiver 1330 through a channel pair 1320. The receiver 1330 may include a high pass filter 1340 to receive first and second differential signals B and /B passed through the channel pair 1320, a controller 1350 to generate first control signals X[m:0] and second control signals Y[n:0], and a Schmitt trigger 1360 to compare the output signals C and /C of the high pass filter 1340 to a first power supply voltage V_term in response to the first and second control signals X[m:0] and Y[n:0] and to generate output signals OUT and /OUT. The output signals OUT and /OUT of the Schmitt trigger 1360 may be output as an output signal D of the receiver 1330 through an amplifier 1370.

The high pass filter 1340 may include a first capacitor 1341 having a first terminal to receive the first differential signal B passed through one of the channel pair 1320, a first resistor 1342 connected to a second terminal of the first capacitor 1341 and the source of the first power supply voltage V_term, a second capacitor 1343 having a first terminal to receive the second differential signal /B passed through the other one of the channel pair 1320, and a second resistor 1344 connected to a second terminal of the second capacitor 1343 and the source of the first power supply voltage V_term.

The Schmitt trigger 1360 may be similar to the Schmitt trigger 760 illustrated in FIG. 8. However, the output signal C of the first capacitor 1341 of the high pass filter 1340 may be connected to the gate of the first NMOS transistor 803 of the Schmitt trigger 760 illustrated in FIG. 8, and the output signal /C of the second capacitor 1343 of the high pass filter 1340 may be connected to the gate of the second NMOS transistor 804 of the Schmitt trigger 760 illustrated in FIG. 8.

In order to receive the differential signals B and /B transmitted through the channel pair 1320 in a differential signaling mode, the high pass filter 1340 and the Schmitt trigger 1360 may vary the signal gain of the receiver 1330 under the control of the first and second control signals X[m:0] and Y[n:0]. Thus, signal gain loss according to the characteristics of the channel pair 1320 may be compensated for.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A receiver configured to reduce intersymbol interference of at least one data transmission channel and compensate for signal gain loss, comprising:
   a high pass filter;
   a Schmitt trigger controlled by a plurality of first control signals and a plurality of second control signals, the Schmitt trigger being configured to compare a first signal from the high pass filter to a first power supply voltage in response to the plurality of first control signals and the plurality of second control signals, and to generate a first output signal and a second output signal;
   a controller configured to generate the plurality of first control signals and the plurality of second control signals; and
   an amplifier configured to receive the first output signal and the second output signal, and to generate an output signal of the receiver,
   wherein the Schmitt trigger includes:
      first and second resistors having first terminals to which a second power supply voltage is applied;
      a first NMOS transistor having a drain connected to a second terminal of the first resistor to output the second output signal, and a gate to which the first signal from the high pass filter is applied;
      a second NMOS transistor having a drain connected to a second terminal of the second resistor to output the second output signal, and a gate to which the first power supply voltage is applied;
      a third NMOS transistor having a drain connected to the second terminal of the first resistor, and a gate to which the first output signal is applied;
      a fourth NMOS transistor having a drain connected to the second terminal of the second resistor, and a gate to which the second output signal is applied;
      a first trigger voltage controller connected to the sources of the first and second NMOS transistors and a ground voltage source, and controlled by the plurality of second control signals; and
      a second trigger voltage controller connected to the sources of the third and fourth NMOS transistors and the ground voltage source, and controlled by the plurality of first control signals.

2. The receiver of claim 1, wherein the first trigger voltage controller comprises:
   a plurality of current sources connected to the sources of the first and second NMOS transistors; and
   a plurality of NMOS transistors, each respectively connected to one of the plurality of current sources and the ground voltage source, the gates each of the plurality of NMOS transistors respectively receiving one of the plurality of second control signals.

3. The receiver of claim 1, wherein the second trigger voltage controller comprises:
   a plurality of current sources connected to the sources of the third and fourth NMOS transistors; and
   a plurality of NMOS transistors, each respectively connected to one of the plurality of current sources and the ground voltage source, the gates of each of the plurality of NMOS transistors respectively receiving one of the plurality of first control signals.

4. A receiver configured to reduce intersymbol interference of at least one data transmission channel and compensate for signal gain loss, comprising:
a high pass filter;
a Schmitt trigger controlled by a plurality of first control signals and a plurality of second control signals, the Schmitt trigger being configured to compare a first signal from the high pass filter to a first power supply voltage in response to the plurality of first control signals and the plurality of second control signals, and to generate a first output signal and a second output signal;
a controller configured to generate the plurality of first control signals and the plurality of second control signals; and
an amplifier configured to receive the first output signal and the second output signal, and to generate an output signal of the receiver;
wherein the high pass filter is further configured to receive a second input signal passed through a second channel; and
the Schmitt trigger is further configured to compare a second signal from the high pass filter to the first power supply voltage in response to the plurality of first control signals and the plurality of second control signals.

5. The receiver of claim 4, wherein the Schmitt trigger comprises:
first and second resistors having first terminals to which a power supply voltage is applied;
a first NMOS transistor having a drain connected to a second terminal of the first resistor to output the second output signal, and a gate to which the first signal from the high pass filter is applied;
a second NMOS transistor having a drain connected to a second terminal of the second resistor to output the first output signal, and a gate to which the second signal from the high pass filter is applied;
a third NMOS transistor having a drain connected to the second terminal of the first resistor, and a gate to which the first output signal is applied;
a fourth NMOS transistor having a drain connected to the second terminal of the second resistor, and a gate to which the second output signal is applied;
a first trigger voltage controller connected to the sources of the first and second NMOS transistors and a ground voltage source, and controlled by the plurality of second control signals; and
a second trigger voltage controller connected to the sources of the third and fourth NMOS transistors and the ground voltage source, and controlled by the plurality of first control signals.

6. The receiver of claim 5, wherein the first trigger voltage controller comprises:
a plurality of current sources connected to the sources of the first and second NMOS transistors; and
a plurality of NMOS transistors, each respectively connected to one of the plurality of current sources and the ground voltage source, the gates of each of the plurality of NMOS transistors respectively receiving one of the plurality of second control signals.

7. The receiver of claim 5, wherein the second trigger voltage controller comprises:
a plurality of current sources connected to the sources of the third and fourth NMOS transistors; and
a plurality of NMOS transistors, each respectively connected to one of the plurality of current sources and the ground voltage source, the gates of each of the plurality of NMOS transistors respectively receiving one of the plurality of first control signals.

8. The receiver of claim 4, wherein the high pass filter comprises:
a first capacitor having a first terminal to which the first input signal passed through the first channel is applied;
a first resistor connected to a second terminal of the first capacitor and the source of the first power supply voltage;
a second capacitor having a first terminal to which the second input signal passed through the second channel is applied; and
a second resistor connected to a second terminal of the second capacitor and the source of the first power supply voltage,
wherein a signal of the second terminal of the first capacitor becomes the first signal from the high pass filter, and a signal of the second terminal of the second capacitor becomes the second signal from the high pass filter.

9. The receiver of claim 4, wherein the first power supply voltage is a termination voltage applied to each of the at least one channels.

* * * * *